(12) United States Patent
Bernardson

(10) Patent No.: US 6,876,233 B1
(45) Date of Patent: Apr. 5, 2005

(54) DC CANCELLATION APPARATUS AND METHOD

(75) Inventor: Peter S. Bernardson, Phoenix, AZ (US)

(73) Assignee: Medtronics, Inc., Minneapolis, MN (US)

( * ) Notice: Subject to any disclaimer, the term of this patent is extended or adjusted under 35 U.S.C. 154(b) by 0 days.

(21) Appl. No.: 10/367,318

(22) Filed: Feb. 15, 2003

(51) Int. Cl.$^7$ ............................................. H03K 17/00
(52) U.S. Cl. ........................... 327/98; 327/307; 330/288
(58) Field of Search ................. 327/98, 307, 538–541, 327/545, 552; 330/288; 323/315, 316

(56) References Cited

U.S. PATENT DOCUMENTS

| | | | |
|---|---|---|---|
| 5,625,281 A | * | 4/1997 | Lambert ..................... 323/315 |
| 5,703,353 A | | 12/1997 | Blalock et al. ......... 250/214 C |
| 5,900,625 A | | 5/1999 | Baumgartner ........... 250/214 C |
| 2002/0089728 A1 | | 7/2002 | Kim ............................ 359/189 |

* cited by examiner

Primary Examiner—Kenneth B. Wells
(74) Attorney, Agent, or Firm—Girma Wolde-Michael

(57) ABSTRACT

Methods and apparatus are provided for separating DC and AC components of a composite signal Is=Idc+Iac from a current source, e.g., a photodiode current source. Four current mirrors CM-1 . . . CM-4 are used with common branches and overlap. CM-1 through CM-3 mirror Is and CM-4 mirrors Idc where Iac has been removed by a frequency selective branch. Outputs of the Cm-3 and Cm-4 are combined at a node to provide a signal proportional substantially only to Iac. Complementary devices are used where Cm-1 and Cm-4 are of one type and Cm-2 and Cm-3 are of opposite type. The arrangement allows detection of AC signals (e.g., pulses) that are orders of magnitude smaller than the DC background. An I-to-V converter with a large feedback resistance is used at the output to produce a comparatively large voltage output proportional to Iac.

16 Claims, 3 Drawing Sheets

DC CANCELLATION APPARATUS AND METHOD

FIELD OF THE INVENTION

The present invention generally relates to means and methods for removing a substantially direct current (DC) signal so that a superposed alternating current (AC) signal can be more easily detected, and more particularly relates to removing a DC signal so a small superposed pulse signal can more easily be detected.

BACKGROUND OF THE INVENTION

There are many situations in electronic applications where an AC or pulse signal of interest is superposed on a comparatively large substantially DC signal. As used herein the term "direct current" and the abbreviation DC are intended to include any current signal that is slowly varying compared to the signal of interest. Similarly, the term "alternative current" and the abbreviation AC are intended to include any current signal that is varying rapidly compared to a background DC signal. The term AC is intended to include pulse signals and vice versa.

The classical method of removing DC from a composite DC+AC signal is to use an inductor equivalent or switched capacitor circuits. The problem is exacerbated when the AC component is very much smaller in magnitude than the DC component and the composite signal source is a photodiode or other current source component. To implement these solutions in integrated circuit form is complex and/or requires large chip areas, which are undesirable.

In situations where photodiodes or the like are used to detect small optical signals in the presence of relatively large ambient light levels the problem of separating a very small AC (e.g., pulse) signal from the large ambient DC signal can be especially severe. Consider the example a situation where the ambient light causes a background DC signal from a photodiode of about 500 microamps and the AC component desired to be detected is a 100–200 picoamps pulse superimposed on the 500 microamps DC component. This AC pulse signal is about $10^7$ times smaller than the DC ambient signal.

In many cases in order to do further processing on the pulse signal it also often needs to be converted to a voltage. The traditional methods for doing this involve passing the photodiode current though a resistor, either directly or via a feedback resistor associated with an op-amp. FIG. 1 shows prior art op-amp circuit 1 used to convert current Is in current source 2 to voltage Vout at output terminal 8 of circuit 1. Feedback resistor Rfb is connected between nodes 6 and 7. Node 6 is connected to current source 2 and the negative input of op-amp 3. Node 7 is connected to output terminal 8 of op-amp 3. Voltage Vref is connected to terminal 4 and the positive input of op-amp 3. Op-amp 3 is coupled to power supply line 5 having supply voltage Vdd thereon.

When current source 2 provides composite current Is with a large DC component Idc (e.g., $0.5 \times 10^{-3}$ amps) and a small AC component Ip (e.g., $2 \times 10^{-10}$ amps), i.e., Is=Idc+Ip where Idc>>Ip, then it is very difficult to convert Ip to a significant Vout. The voltage Vfb across feedback resistor Rfb cannot exceed power voltage Vdd. Thus, Rfb(max) is given by Vdd/Is. Consider the situation where Vdd is approximately 3 volts, Is~Idc=0.5 milliamps for Ip=200 picoamps. Then Rfb(max)=Vdd/Is=$(3/0.5 \times 10^{-3})$=$6 \times 10^3$ ohms. This results in a very small AC voltage Vp(out) from current-to-voltage converter 1, that is. Vp(out)=Ip×Rfb=$2 \times 10^{-10} \times 6 \times 10^3 = 1.2 \times 10^{-6}$ volts. If the supply voltage for the IC is lower, the value of Rfb must be correspondingly reduced and the Vp(out) corresponding to Ip will be further reduced. When the AC signal to be post processed after current-voltage conversion is superimposed on a large DC signal, the AC voltage output with the prior art arrangement is only a very small fraction of the power supply voltage, making subsequent signal processing more difficult.

Vp(out) of the current voltage converter illustrated in FIG. 1 scales linearly with Rfb, while the noise voltage V(noise)=$(4kT*Rfb*\Delta f)^{1/2}$ scales only with the square root of the resistance. For Example, the Signal to Noise Ratio (SNR) for a given value of Ip is given by:

$$SNR = V(\text{signal})/V(\text{noise}) = Vp(\text{out})/(4kT*Rfb*\Delta f)^{1/2} = Ip*Rfb/(4kT*Rfb*\Delta f)^{1/2} = \text{Constant}*(Rfb)^{1/2} \quad \text{Eq. 1}$$

where * indicates multiplication. Thus, for optimal signal/noise performance, large values of Rfb are better. But with the prior art arrangements, large values of Rfb are not possible with small supply voltages.

Accordingly, there is an ongoing need to detect small AC signals, particularly small pulse signals in the presence of a large DC ambient signal and to separate the AC signals for further processing. In addition, there is an ongoing need to provide for current-to-voltage conversion of the AC component of superimposed current signals using large resistance values. Further, there is an ongoing need to convert currents with superposed large DC and very small AC components in a manner so that large AC voltage swings can be obtained relative to the power supply voltage. In addition, there is an ongoing need to provide DC-AC current separation and conversion in a manner that is suitable for fabrication in a monolithic integrated circuit. Still further, there is an ongoing need for means and method for separating the DC and AC components of the signal current before current-to-voltage conversion. Other desirable features and characteristics of the present invention will become apparent from the subsequent detailed description of the invention and the appended claims, taken in conjunction with the accompanying drawings and this background of the invention.

BRIEF SUMMARY OF THE INVENTION

An apparatus is provided for separating DC and AC components of a composite signal provided by a signal source, comprising: a first current mirror having an input branch coupled to the signal source and receiving the composite signal, and having an output branch; a second current mirror having an input branch coupled to the output branch of the first current mirror, and having an output branch, wherein the output branch of the second current mirror has DC and AC frequency discriminate sub-branches that separate DC and AC components of the composite signal, respectively; a third current mirror having an input branch coupled to the output branch of the first current mirror; and a fourth current mirror having an input branch coupled to the DC frequency discriminate branch of the second current mirror and an output branch coupled to the output branch of the third current mirror at a common node, wherein a signal proportional substantially only to the AC component of the composite signal is present at the common node.

A method is provided for separating a DC component from an AC component of a composite signal provided by a signal source, the method comprising: receiving an input signal proportional to Is; mirroring the input signal in a first current mirror to obtain a first signal substantially equal the input signal; mirroring the first signal in second and third current mirrors, respectively, second and third signals substantially equal to the first signal on outputs of the second and third current mirrors, respectively; decomposing the second signal into an AC component and a DC component, wherein the DC component flows through an input branch of a fourth current mirror and a fourth signal substantially equal to the DC component flows in the output branch of the fourth current mirror; and combining the third signal and the fourth signal to obtain an output signal substantially proportional to the AC component.

BRIEF DESCRIPTION OF THE DRAWINGS

The present invention will hereinafter be described in conjunction with the following drawing figures, wherein like numerals denote like elements.

DETAILED DESCRIPTION OF THE INVENTION

The following detailed description of the invention is merely exemplary in nature and is not intended to limit the invention or the application and uses of the invention. Furthermore, there is no intention to be bound by any theory presented in the preceding background of the invention or the following detailed description of the invention.

Figure 1:
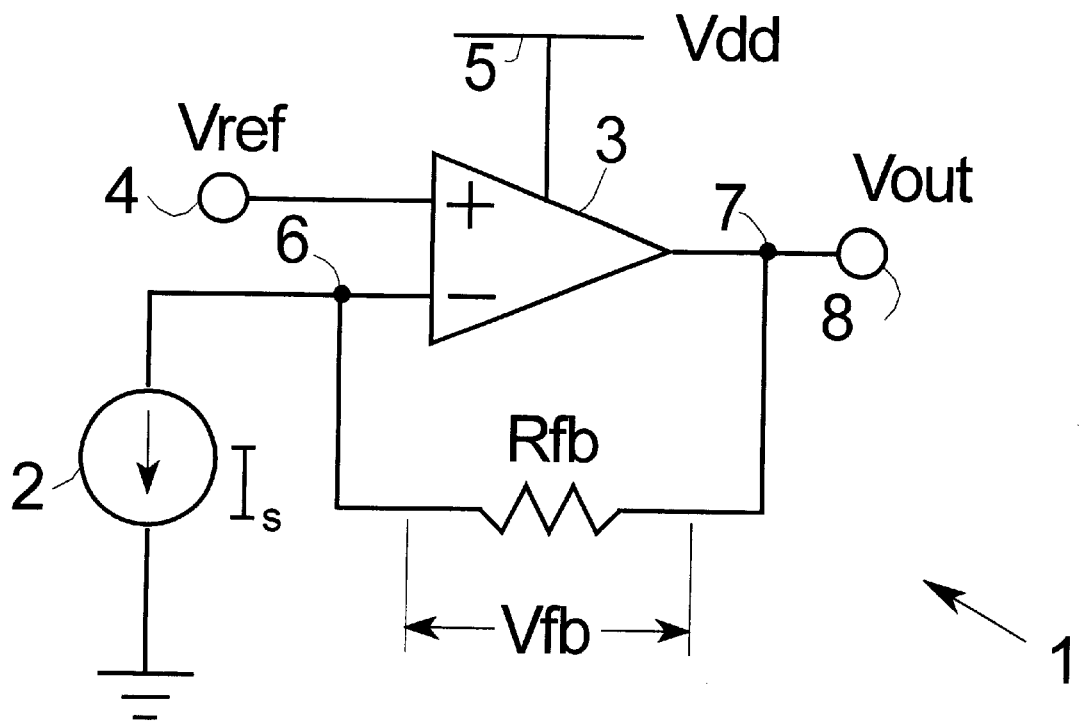
FIG. 1 is a simplified schematic diagram of a prior art current-to-voltage converter circuit.
Figure 2:
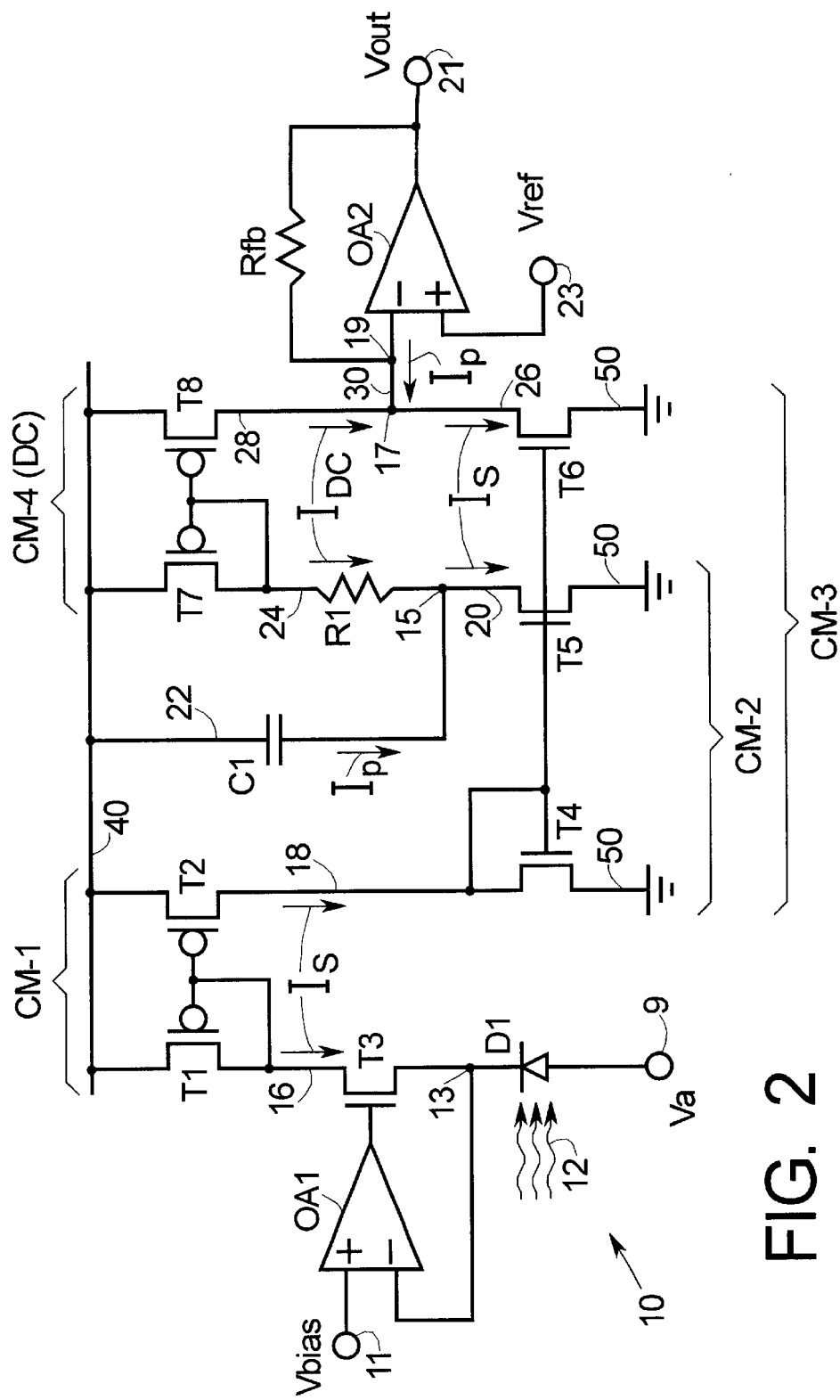
FIG. 2 is a simplified schematic diagram of an electronic circuit for separating the DC and AC components of a composite DC+AC signal, according to the present invention.

FIG. 2 is a simplified schematic diagram of electronic circuit 10 for separating the DC and AC components of a composite DC+AC signal, according to the present invention. For convenience of explanation, circuit 10 is illustrated for the circumstance where the composite electrical signal Is originates from photo-detector D1, but persons of skill in the art will understand that other sources of the composite signal may be used and that the present invention is not limited by the choice of composite signal source.

Composite optical signal 12 falls on photo-detector D1, thereby modulating its conductivity in accordance with alterations, for example, in the magnitude of the light intensity. By including filters or other optical input modifiers, the output of D1 can be made to vary according to light wavelength or other properties. For simplicity of explanation it is assumed herein that the light intensity is varied, but persons of skill in the art will understand that the present invention is not limited simply to this form of optical variation and any arrangement that causes the output of D1 to vary is included in the present invention. D1 can be a photo-diode or phototransistor or other optically sensitive component that converts light to an electrical current or voltage. In the present example where a photodiode or phototransistor is used for D1, Is=Idc+Ip where Is is the total (i.e., composite) current flowing through D1, Idc is the current component caused by the substantially steady ambient light and Ip=Iac is the superposed component caused by a light pulse or other time varying transient light input to D1.

Photo-detector D1 generally acts as a current source. For convenience of explanation, transistors T1, T2, T7, T8 in circuit 10 are conveniently PMOS transistors and transistors T3, T4, T5, T6 in circuit 10 are conveniently NMOS transistors. Thus, T1, T2, T7, T8 and T3, T4, T5, T6 are complementary transistor types. Persons of skill in the art will understand that bipolar transistors and JFETS of appropriate type can also be used and that complementary types (e.g., N-type and P-type devices) can be interchanged with appropriate modification of power supply polarities and voltages.

Vbias is coupled to bias input terminal 11 and is chosen to provide a suitable operating point for D1. Vbias input terminal 11 is coupled to the positive input of operational amplifier OA1. The negative terminal of OA1 is coupled to node 13 in branch 16 of circuit 10. Persons of skill in the art understand how to provide the proper bias of D1 based upon its properties and the optical signals to be received by D1. Operation amplifier OA1 and transistor T3 conveniently act as a buffer transferring Vbias from the positive input of OA1 to node 13. While OA1 and transistor T3 are a convenient means of establishing Vbias for photo-detector D1 at node 13, persons of skill in the art will understand that other arrangements can also be used. D1 is coupled between source 9 of anode reference voltage Va and node 13.

Transistor T3 is coupled between node 13 and the drain of transistor T1. The sources of transistors T1, T2, T7, T8 are coupled to power rail 40. The drain and gate of T1 are shorted together. Composite current Is=Idc+Ip flows through transistors T1, T3, node 13 and photo-detector D1 in response to composite light input 12. Transistors T1, T2 act as first current mirror CM-1. Thus, within the accuracy of the current mirror, the current flowing in branch 16 of CM-1 and the current flowing in branch 18 of CM-1 are substantially equal, that is, a current of magnitude Is=Idc+Ip flows in both branch 16 and 18 of CM-1.

Transistors T4, T5, T6 have their sources coupled to ground 50. Transistor T4 has its drain and gate tied together. The drain of transistor T4 is coupled to the drain of T2. The gates of transistors T4, T5, T6 are common. Transistors T4, T5 form a second current mirror CM-2. The drain of T5 is coupled to node 15 where that branch of CM-2 splits into AC branch 22 and DC branch 24. The purpose of CM-2 is to allow Is to be split into AC and DC components using, for example, capacitor C1 in branch 22, and transistor T7 and resistor R1 in branch 24, respectively. Capacitor C1 is coupled between node 15 and power rail 40 (which is at AC ground). While capacitor C1 is a useful means of providing a low AC impedance shunt path, other frequency selective arrangements can also be used. Resistor R1 and Transistor T7 are coupled between node 15 and power rail 40. Transistor T7 has its drain connected to its gate. The gates of T7 and T8 are tied together to form a current mirror. Since composite current Is flows in branch 18 of CM-2, a substantially equal composite current Is=Idc+Ip also flows in branch 20 of CM-2. Branch 20 of CM-2 splits at node 15 into branches 22, 24. The AC impedance of branch 24 should be much larger than the AC impedance of branch 22 and the DC impedance of branch 22 much larger than the DC impedance of branch 24, so that the AC portion Ip of composite signal Is substantially all flows through branch 22 and the DC portion Idc of composite signal Is substantially all flows through branch 24.

Transistors T4, T6 form a third current mirror. Transistor T6 is coupled between ground 50 and node 17. Since current Is flows in branch 18 of CM-3, an equal current Is=Idc+Ip flows in branch 26 of CM-3. Current mirrors CM-1, CM-2, CM-3 all conduct substantially equal currents of magnitude Is=Idc+Ip. Branch 26 splits at node 17 into branches 28 and 30. Transistor T8 in branch 28 is coupled between node 17 and power rail 40. Branch 30 couples nodes 17 and 19.

Transistors T7, T8 form a fourth current mirror CM-4 with substantially equal currents Idc in branches 24, 28. Since capacitor C1 in branch 22 substantially by passes Ip around transistor T7 and resistor R1, substantially only Idc flows in branch 24 and a substantially equal current Idc flows in branch 28 of the mirrored pair T7, T8. Branches 26, 28 and 30 join at node 17. Due to CM-4, substantially only Idc flows in branch 28 and, due to CM-3 composite current Is=Idc+Ip flows in branch 26. Therefore branch 30 from node 19 to node 17 must supply a current to node 17 substantially equal to Ip. Op-amp OA2 and feedback resistor Rfb convert Ip at node 19 to an output voltage Vout at output terminal 21 that is substantially proportional only to Ip. Resistor Rfb is coupled between output terminal 21 of OA2 and node 19. Node 19 is coupled to the negative input of OA2 and to node 17. The positive input of OA2 is coupled to terminal 23 and Vref. Vref allows any offset inherent in OA2 to be compensated and for the DC level of Vout to be set to any desired value. The invented arrangement allows much larger values to be used for Rfb, thereby providing larger Vp(out) and improved signal to noise ratio. For example, where $Ip=2\times10^{-10}$ amps and power supply voltage Vdd available to OA2 is 3 volts, Rfb can be as large as $Rfb(max)=Vdd/Ip=(3/2\times10^{-10})=1.5\times10^{10}$ Ohms. Thus, current components Iac=Ip that are smaller than Idc by one or more orders of magnitude, even by a factor of $10^5$ to $10^7$ or more, can be separated and converted to a comparatively large output voltage whose swing is a significant fraction of the available power supply voltage.

Figure 3:
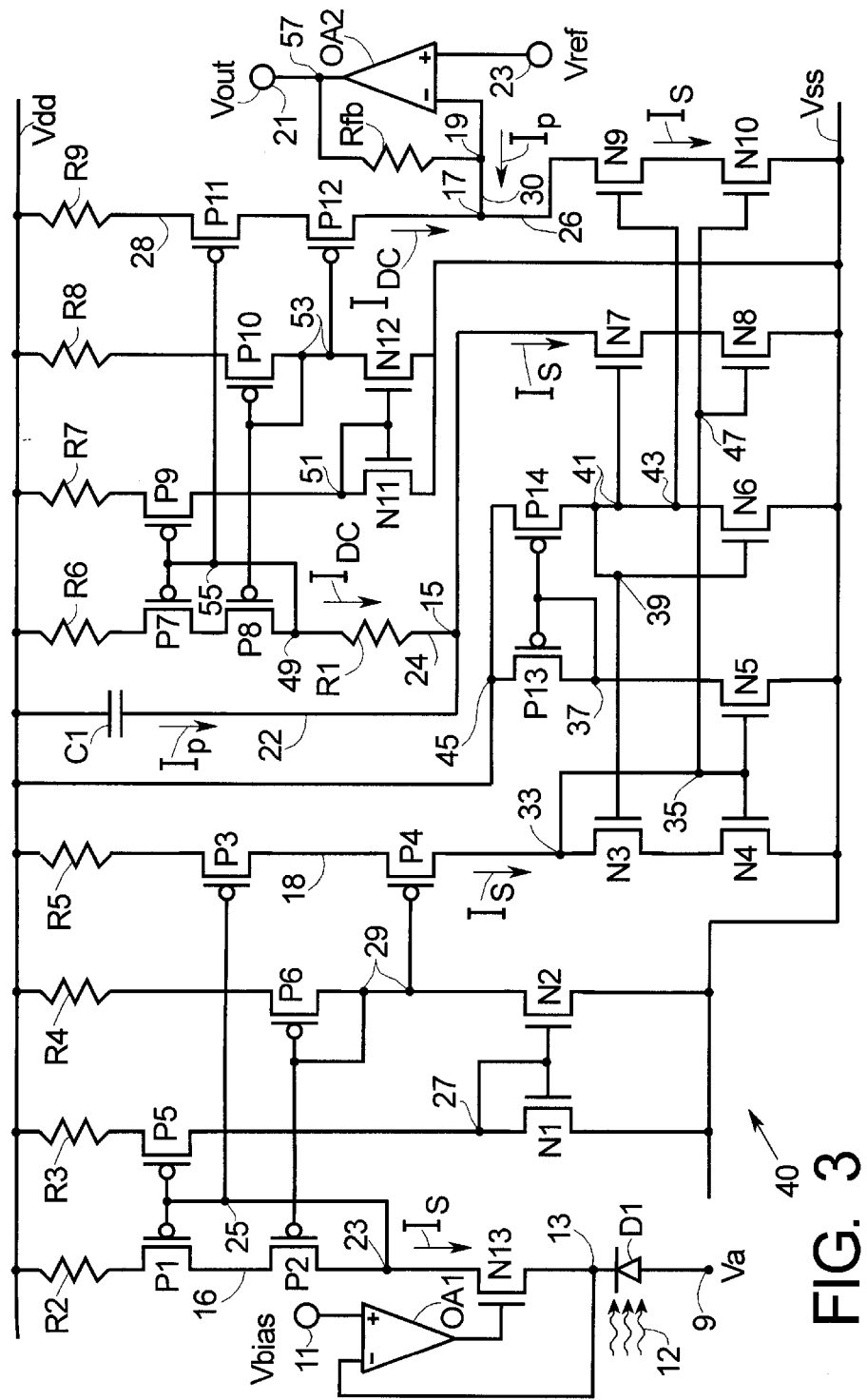
FIG. 3 is a simplified schematic similar to FIG. 1 but according to a further embodiment and showing further details.

FIG. 3 is a simplified schematic of DC suppression circuit 40 similar to circuit 10 FIG. 2 but according to a further embodiment and showing further details. Equivalent nodes and terminals are identified by the same reference numbers as in FIG. 2. Circuit 40 employs what are called telescoping mirrors and cascade bias circuits to increase the accuracy of the current mirrors and thereby the separation of Idc and Ip of the composite signal Is. For convenience of explanation, the functions of the various transistors in FIG. 3 are explained by relating them to the transistors and current mirrors in FIG. 2. The convention P1, P2, . . . Pn is used to identify PMOS devices and N1, N2, . . . Nn to identify NMOS devices but this is not intended to be limiting. Persons of skill in the art understand that other types of complementary devices can be used and that complementary device types can also be interchanged.

Resistor R2, transistors P1, P2, node 23 and transistor N13, node 13, and Diode D1 are serially coupled between Vdd and Va. Resistor R3, transistor P5, node 27 and transistor N1 are serially coupled between Vdd and Vss. Resistor R4, and transistor P6, node 29 and transistor N2 are serially coupled between Vdd and Vss. The gates of P1, P5 are tied together and to nodes 23 and 25. The gates of P2 and P6 are tied together and to node 29. The gate of P3 is tied to node 25. The gate of P4 is tied to node 29. Resistor R5, transistors P3 and P4, node 33 and transistors N3 and N4 are serially coupled between Vdd and Vss. Transistor P13, node 37 and transistor N5 are serially coupled between Vdd (via node 45) and Vss. Transistor P14, node 41, node 43 and transistor N6 are serially coupled between Vdd (via node 45) and Vss. The gates of P13 and P14 are tied together and to node 37. The gates of transistors N4, N5 are tied together and to nodes 33 and 35. The gate of transistor N6 is tied to node 39. Transistors N7, N8 are serially coupled from node 15 to Vss. The gate of N7 is tied to nodes 39, 41 as are the gate of N3, N6. The gate of N8 is tied to nodes 47 and 35. Transistors N9 and N10 are serially coupled between node 17 and Vss. The gate of N9 is coupled to node 43. The gate of N10 is coupled to nodes 35, 47 as is the gate of N8. Capacitor C1 is coupled from Vdd to node 15. Resistor R6, transistors P7 and P8, node 49 and resistor R1 are serially coupled between Vdd and node 15. Resistor R7, transistor P9, node 51, and transistor N11 are serially coupled between Vdd and Vss. Resistor R8, transistor P10, node 53, and transistor N12 are serially coupled between Vdd and Vss. Resistor R9, transistors P11 and P12 are serially coupled between Vdd and node 17. The gates of P7, P9 are tied together and to nodes 55 and 49 and the gate of transistor P11. The gates of transistors P8, P10 are tied together and to node 53 and the gate of P12. The gates of transistors N11, N12 are tied together and to node 51. Node 17 is coupled by branch 30 to node 19, which is in turn coupled to resistor Rfb and the negative input of OA2. The other terminal of Rfb is coupled to node 57 at the output of OA2 and output terminal 21 where Vout appears. Vref is provided via terminal 23, which is coupled to the positive input of OA2. Vout is the output voltage corresponding to Ip.

Transistors P1, P2 perform the same function as T1 in circuit 10 and transistors P3, P4 perform the same function as transistor T2 in circuit 10, thus forming first current mirror CM-1. Transistors P5, P6, N1, N2 create a cascode bias voltage for CM1 to improve the current matching and thus the mirror accuracy.

Transistors N3, N4 and N7, N8 of circuit 40 perform the same function as transistors T4, T5 of circuit 10, respectively and form second current mirror CM-2 identified in connection with FIG. 2. Transistors P13, P14 and N5, N6 form another cascode bias circuit analogous to the cascode bias circuit formed by P5, P6, N1, N2 feeding CM1.

Transistors N3, N4 and N9, N10 of circuit 40 perform the same function as transistors T4 and T6 of circuit 10, respectively and form third current mirror CM-3 identified in connection with FIG. 2. The cascode bias circuit formed by P13, P14 and N5, N6 also serves CM-3.

Transistors P7, P8 and P11, P12 of circuit 40 perform the same function as transistors T7 and T8 of circuit 10, respectively and form fourth current mirror CM-4 identified in connection with FIG. 2. Transistors P9, P10 and N11, N12 form another cascode bias analogous to cascode bias P5, P6, N1, N2 feeding CM1. Op-amp OA2, feedback resistor Rfb and Vref provide the same functions as already described in connection with FIG. 2. As note earlier, other methods of converting current Ip at node 19 to output voltage Vout at terminal 21 may also be used. Circuit 40 of FIG. 3 functions in fundamentally the same manner as circuit 10 of FIG. 2 but provides greater mirror accuracy and improved Idc suppression to extract very small pulse current Ip from large composite signal Is=Idc+Ip. The arrangement of FIG. 3 is preferred.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention. It being understood that various changes may be made in the function and arrangement of elements described in an exemplary embodiment without departing from the scope of the invention as set forth in the appended claims.

What is claimed is:

1. A circuit for separating DC and AC components of a composite signal provided by a signal source, comprising:

a first current mirror having an input branch coupled to the signal source and receiving the composite signal, and having an output branch;

a second current mirror having an input branch coupled to the output branch of the first current mirror, and having an output branch, wherein the output branch of the second current mirror has DC and AC frequency discriminate sub-branches that separate DC and AC components of the composite signal, respectively;

a third current mirror having an input branch coupled to the output branch of the first current mirror; and a fourth current mirror having an input branch coupled to the DC frequency discriminate branch of the second current mirror and an output branch coupled to the output branch of the third current mirror at a common node, wherein a signal proportional substantially only to the AC component of the composite signal is present at the common node.

2. The circuit of claim 1 further comprising a current to voltage converter coupled to the common node for producing an output voltage proportional to the AC component of the composite signal.

3. The circuit of claim 1 wherein the output branch of the first current mirror and the input branch of the second and third current mirrors are common.

4. The circuit of claim 1 wherein fourth current mirror conducts substantially only the DC component of the composite signal.

5. The circuit of claim 1 wherein output branch of the third current mirror and the output branch of the fourth current mirror are in part common.

6. Apparatus for separating a DC component and an AC component of a composite signal provided by a signal source, the apparatus comprising:

first, second, third and fourth current mirrors, the first current mirror having an input branch coupled to the signal source and carrying a first signal proportional to the composite signal and having an output branch also carrying substantially said first signal and common with the input branch of the second and third current mirrors;

wherein the second current mirror has an output branch with a first pathway for a second signal proportional to the DC component and a second pathway for a third signal proportional to the AC component; and wherein the fourth current mirror has an input branch common with the first pathway of the second current mirror carrying the second signal proportional to the DC component, and an output branch carrying a fourth signal substantially equal to the first signal proportional to the AC component and wherein the output branch of the fourth current mirror and the output branch of the third current mirror are coupled at a common node and an output signal proportional to the AC component is present at the node.

7. The apparatus of claim 6 further comprising a current to voltage converter coupled to the common node for producing an output voltage proportional to the AC component of the composite signal.

8. The apparatus of claim 6 wherein the signal source is a current source.

9. The apparatus of claim 6 wherein the magnitude of AC component is at least an order of magnitude smaller compared to the DC component.

10. The apparatus of claim 6 wherein the first and fourth current mirrors are of a first conductivity type devices and the second and third current mirrors are of a second conductivity type devices opposite the first conductivity type devices.

11. The apparatus of claim 6 further comprising a current-to-voltage converter for generating an output voltage proportional to the AC component of the composite signal.

12. The apparatus of claim 8 further comprising means for biasing the current source.

13. A method for separating a DC component Idc and an AC component Iac of a composite signal Is=Idc+Iac provided by a signal source, the method comprising:

receiving an input signal proportional to Is;

mirroring the input signal in a first current mirror to obtain a first signal substantially equal the input signal;

mirroring the first signal in second and third current mirrors to obtain, respectfully, second and third signals substantially equal to the first signal on outputs of the second and third current mirrors, respectively;

decomposing the second signal into an AC component and a DC component, wherein the DC component flows through an input branch of a fourth current mirror and a fourth signal substantially equal to the DC component flows in an output branch of the fourth current mirror; and combining the third signal and the fourth signal to obtain an output signal substantially proportional to Iac.

14. The method of claim 13 wherein the receiving step comprises receiving current from one of a photo-detector and other current source.

15. The method of claim 13 wherein the combining step comprises obtaining a current output signal proportional to Iac and further comprising after the combining step, generating a voltage output signal proportional to Iac.

16. The method of claim 13 wherein the decomposing step comprises using a first AC discriminate branch that passes substantially all the AC components of the composite signal and a second DC discriminate branch that passes substantially all the DC components of the composite signal.

* * * * *